United States Patent
Feng et al.

(10) Patent No.: US 10,804,783 B2
(45) Date of Patent: Oct. 13, 2020

(54) HEAT DISSIPATION APPARATUS AND COMMUNICATIONS DEVICE

(71) Applicants: Huawei Technologies Co., Ltd., Shenzhen (CN); University of Science and Technology of China, Hefei (CN)

(72) Inventors: Zhihua Feng, Hefei (CN); Liang Li, Shenzhen (CN); Xinxin Liao, Hefei (CN)

(73) Assignees: Huawei Technologies Co., Ltd., Shenzhen (CN); University of Science and Technology of China, Hefei (CN)

( * ) Notice: Subject to any disclaimer, the term of this patent is extended or adjusted under 35 U.S.C. 154(b) by 0 days.

(21) Appl. No.: 16/179,563

(22) Filed: Nov. 2, 2018

(65) Prior Publication Data

US 2019/0075680 A1 Mar. 7, 2019

Related U.S. Application Data

(63) Continuation of application No. PCT/CN2017/081927, filed on Apr. 25, 2017.

(30) Foreign Application Priority Data

May 5, 2016 (CN) .......................... 2016 1 0296771

(51) Int. Cl.
*H02K 33/02* (2006.01)
*H05K 7/20* (2006.01)
(Continued)

(52) U.S. Cl.
CPC .......... *H02K 33/02* (2013.01); *F04B 45/047* (2013.01); *F04D 19/002* (2013.01);
(Continued)

(58) Field of Classification Search
CPC . H05K 7/20172; F04D 25/0606; F04D 25/08; F04D 33/00; F04D 29/646; F04D 19/002; F04B 45/047; H02K 33/02
(Continued)

(56) References Cited

U.S. PATENT DOCUMENTS 2,895,063 A * 7/1959 Morris .................... F42C 11/04
310/15
5,522,712 A   6/1996 Winn
(Continued)

FOREIGN PATENT DOCUMENTS

CN          2443670 Y    8/2001
CN        201037478 Y    3/2008
(Continued)

*Primary Examiner* — John K Kim

(74) *Attorney, Agent, or Firm* — Leydig, Voit & Mayer, Ltd.

(57) ABSTRACT

Embodiments of the present invention provide a heat dissipation apparatus. Wherein a loop coil is disposed on a swing plate. A first magnet and a second magnet are located on two sides of the loop coil, and when a current whose direction periodically varies flows through the loop coil, an Ampere force whose direction periodically varies is applied to the loop coil under an action of a magnetic field formed by the first magnet and the second magnet, so that the loop coil drives the swing plate to swing back and forth. The present invention is used for heat dissipation of a micro electronic component.

14 Claims, 3 Drawing Sheets

(51) Int. Cl.
*F04D 19/00* (2006.01)
*F04D 29/64* (2006.01)
*F04B 45/047* (2006.01)
*F04D 33/00* (2006.01)
*F04D 25/08* (2006.01)
*F04D 25/06* (2006.01)

(52) U.S. Cl.
CPC ......... *F04D 25/0606* (2013.01); *F04D 25/08* (2013.01); *F04D 29/646* (2013.01); *F04D 33/00* (2013.01); *H05K 7/20172* (2013.01)

(58) Field of Classification Search
USPC ...................................................... 310/29, 36
See application file for complete search history.

(56) References Cited

U.S. PATENT DOCUMENTS

| | | | | |
|---|---|---|---|---|
| 5,994,854 A | * | 11/1999 | Lawrenson | ......... B01F 11/0266 |
| | | | | 310/15 |
| 6,043,978 A | | 3/2000 | Mody et al. | |
| 7,485,991 B2 | * | 2/2009 | Kim | ........................ F04D 33/00 |
| | | | | 310/15 |
| 9,523,367 B2 | * | 12/2016 | Lucas | ..................... F04D 33/00 |
| 2006/0138875 A1 | | 6/2006 | Kim et al. | |
| 2008/0286133 A1 | | 11/2008 | He et al. | |
| 2008/0303357 A1 | * | 12/2008 | Battlogg | ................ H02K 35/02 |
| | | | | 310/15 |
| 2009/0072637 A1 | | 3/2009 | Chang et al. | |
| 2009/0121567 A1 | | 5/2009 | Chou et al. | |
| 2013/0309107 A1 | | 11/2013 | Chen et al. | |
| 2014/0017102 A1 | | 1/2014 | Ma et al. | |
| 2015/0152859 A1 | | 6/2015 | Tsai et al. | |
| 2019/0075680 A1 | * | 3/2019 | Feng | ..................... F04D 25/08 |

FOREIGN PATENT DOCUMENTS

| | | |
|---|---|---|
| CN | 101153617 A | 4/2008 |
| CN | 101370373 A | 2/2009 |
| CN | 103423174 A | 12/2013 |
| CN | 103541917 A | 1/2014 |
| CN | 204947875 U | 1/2016 |
| DE | 102012018562 A1 | 3/2014 |
| EP | 0733168 A1 | 6/1996 |
| FR | 2528500 A1 | 12/1983 |
| JP | 2005133555 A | 5/2005 |
| TW | 200838405 A | 9/2008 |
| TW | 201522890 A | 6/2015 |
| WO | 9516137 A1 | 6/1995 |

* cited by examiner

HEAT DISSIPATION APPARATUS AND COMMUNICATIONS DEVICE

CROSS-REFERENCE TO RELATED APPLICATIONS

This application is a continuation of International Application No. PCT/CN2017/081927, filed on Apr. 25, 2017, which claims priority to Chinese Patent Application No. 201610296771.9, filed on May 5, 2016. The disclosures of the aforementioned applications are hereby incorporated by reference in their entireties.

TECHNICAL FIELD

Embodiments of the present invention relate to the field of heat dissipation technologies, and in particular, to a heat dissipation apparatus and a communications device.

BACKGROUND

Currently, with rapid development of electronic technologies, industrial application of electronic components is increasingly popular. Generally, an electronic component generates heat during normal running, and if the heat is not promptly dissipated for the electronic component, the electronic component may be damaged and cannot run normally.

To ensure that the electronic component can run normally, heat is usually dissipated by using an electromagnetic rotary fan in the prior art. FIG. 1 shows an electromagnetic rotary fan in the prior art. By means of electromagnetic rotation, a blade 30 is driven to rotate, so that air flows to implement heat dissipation. An outer frame 10 fastens the fan to a necessary position. The electromagnetic rotary fan effectively resolves a heat dissipation problem of an electronic component, and is widely applied to various electronic devices.

However, in the electromagnetic rotary fan in the prior art, a bearing located in a rotation center is prone to abrasion in actual use, and in addition, the blade rapidly rotates, thereby resulting in relatively big noise.

SUMMARY

Embodiments of the present invention provide a heat dissipation apparatus and a communications device, so as to ensure that generated noise is lower when heat is dissipated for an electronic component.

To achieve the foregoing objective, the following technical solutions are used in the embodiments of the present invention:

A first aspect of the present invention provides a heat dissipation apparatus, including: a base; a swing plate, where the swing plate includes a fastening end and a free end, the fastening end is fastened to the base, the free end may swing relative to the fastening end, and a loop coil is disposed on the swing plate; and a magnet assembly, where the magnet assembly includes a first magnet and a second magnet that are fastened relative to the base, same magnetic poles of the first magnet and the second magnet are opposite to each other, the first magnet and the second magnet are located on two sides of the loop coil, and when a current whose direction periodically varies flows through the loop coil, an Ampere force whose direction periodically varies is applied to the loop coil under an action of a magnetic field formed by the magnet assembly, so that the loop coil drives the swing plate to swing back and forth.

The heat dissipation apparatus provided in this embodiment of the present invention includes the base, the swing plate, and the magnet assembly. The fastening end of the swing plate is fastened to the base, and the other end serving as the free end may swing relative to the fastening end. The loop coil is further disposed on the swing plate, and the first magnet and the second magnet whose same poles are opposite to each other are connected to the base in a fastening manner and are located on the two sides of the loop coil. Because the same poles of the first magnet and the second magnet are opposite to each other, a direction of a magnetic field between the first magnet and the second magnet is basically parallel to the loop coil. When a periodic-varying current flows through the loop coil, according to a magnetic field force principle of an electrified conductor, a downward or upward Ampere force perpendicular to the loop coil may be applied to the loop coil, so that the loop coil drives the swing plate to swing back and forth, and air flows to dissipate heat for a to-be-cooled object. Only the swing plate with the fastening end needs to be disposed in a structure of the heat dissipation apparatus, and Ampere forces from the first magnet and the second magnet to an electrified coil are utilized to drive the swing plate to swing. Therefore, in comparison with the prior art, if a size of a rotary cooling fan is close to a size of the swing plate in this embodiment of the present invention, an air vibration range is smaller when swing is compared with rotation, and a bearing-free solution is used, so that generated noise is lower.

According to the first aspect of the present invention, in a first possible implementation, a through hole is disposed on the swing plate, the loop coil is disposed around the through hole, the magnet assembly includes a magnetic conductive part, the magnetic conductive part penetrates through the through hole, and two ends of the magnetic conductive part are respectively connected to the same magnetic poles of the first magnet and the second magnet.

The magnetic conductive part is disposed between the first magnet and the second magnet, and the two ends of the magnetic conductive part are respectively connected to the same magnetic poles of the first magnet and the second magnet. Therefore, the magnetic conductive part can adjust magnetic field distribution of the first magnet and the second magnet, so that the magnetic field between the first magnet and the second magnet is not weakened by repulsion of the same magnetic poles. In addition, on an outer surface of the magnetic conductive part, a magnetic direction is a direction approximately perpendicular to the outer surface of the magnetic conductive part, that is, a direction parallel to the loop coil. When a current flows through the loop coil, according to the magnetic field force principle of the electrified conductor, a downward or upward vertical force is applied to the loop coil. Further, as a direction of the current that flows through the loop coil periodically varies, the loop coil drives the swing plate to swing back and forth. In comparison with a solution in which the magnetic conductive part is not disposed, a magnetic force between the first magnet and the second magnet is strengthened because of the magnetic conductive part, the Ampere force applied to the loop coil is relatively large, directions are basically consistent, and a magnetic field is efficiently converted into mechanical motion.

Certainly, the magnetic conductive part may not be disposed. When the loop coil is not electrified, the loop coil is located between the first magnet and the second magnet. When a periodic-varying current flows through the loop coil, the swing plate is driven to swing. In a swing process, the loop coil may be out of a range between the first magnet and the second magnet due to inertance or the like. Therefore, the through hole is disposed, so that when the loop coil is out of the range between the first magnet and the second magnet, the first magnet or the second magnet may penetrate through the through hole. In this way, unnecessary collision between the swing plate and a magnet can be avoided. In addition, multiple magnet assemblies including the first magnet, the second magnet, and the magnetic conductive part may be disposed in the through hole, and the loop coil may drive the swing plate to swing.

With reference to the first possible implementation of the first aspect of the present invention, in a second possible implementation, sections that are of the magnetic conductive part and that are on the two sides of the loop coil are symmetrically distributed relative to the loop coil.

With reference to either the first or the second possible implementation of the first aspect, in a third possible implementation of the first aspect, the magnetic conductive part is an arc-shaped magnetic conductive block, and when the swing plate swings, there is a constant gap between an inner wall of the loop coil and an outer wall of the arc-shaped magnetic conductive block.

When the heat dissipation apparatus operates, the loop coil drives the swing plate to swing. In this case, if a gap distance between an inner circle of the loop coil and the magnetic conductive part is shorter, density of a corresponding magnetic induction line is larger, and more energy is obtained. The magnetic conductive part is made in an arc shape, so that the distance between the outer wall of the magnetic conductive part and the inner wall of the loop coil can be as short as possible in a motion process. In an operating process of the heat dissipation apparatus, the distance between the inner wall of the loop coil and the outer wall of the arc-shaped magnetic conductive part is constant, so that the loop coil obtains a relatively steady Ampere force in a motion process, and further, the loop coil drives the swing plate to swing more regularly. When the constant distance is ensured, if the inner wall of the loop coil is closer to the outer wall of the arc-shaped magnetic conductive part, more energy is obtained in principle, and relatively high energy transmission efficiency is further implemented.

With reference to any one of the first to the third possible implementations of the first aspect, in a fourth possible implementation of the first aspect, a shape of the through hole may be flexibly set, for example, a circle or a rectangle, a cross-section shape of the magnetic conductive part matches the shape of the through hole, and a shape of the coil matches the shape of the through hole.

With reference to any one of the first to the fourth possible implementations of the first aspect, in a fifth possible implementation of the first aspect, the loop coil is embedded in the through hole.

With reference to any one of first aspect or the first to the fifth possible implementations of the first aspect, in a sixth possible implementation of the first aspect, the loop coil is located on a surface of one side of the swing plate.

With reference to any one of first aspect or the first to the sixth possible implementations of the first aspect, in a seventh possible implementation of the first aspect, the loop coil is disposed close to the fastening end of the swing plate.

Under an action of an Ampere force, the loop coil drives the swing plate to swing relative to the fastening end of the swing plate. If a distance of motion of the swing plate driven by the loop coil does not change and a length of the swing plate is constant, when the loop coil is closer to the fastening end of the swing plate, swing amplitude of the free end of the swing plate is larger. Enlargement of the swing amplitude may accelerate air exchange, and further, a heat dissipation effect of the heat dissipation apparatus is improved.

With reference to any one of the first aspect or the first to the seventh possible implementations of the first aspect, in an eighth possible implementation of the first aspect, there are multiple swing plates, the multiple swing plates are stacked at intervals, all the multiple swing plates are located between the first magnet and the second magnet and are provided with through holes, and the magnetic conductive part successively penetrates through the through holes on the multiple swing plates.

A clamp may be disposed to fasten the fastening end of the swing plate. The fastening end of the swing plate is nipped in a fastening manner between the clamp and the base, and the clamp may be connected to the base by using a bolt. The swing plate may be made of either carbon fiber or stainless steel. The same magnetic poles of the first magnet and the second magnet are opposite disposed, and the same magnetic poles repel each other. Therefore, based on the disposed magnetic conductive part, the first magnet and the second magnet may be bound to the two ends of the magnetic conductive part.

A second aspect of the present invention provides a communications device, including a housing, a circuit board, and the heat dissipation apparatus in any possible implementation of the first aspect. The circuit board is mounted in the housing, a heat emitting component is disposed on the circuit board, and the heat dissipation apparatus is configured to dissipate heat for the heat emitting component.

In the communications device provided in this embodiment of the present invention, when the circuit board is electrified and enters into an operating mode, the heat emitting component on the circuit board generates heat. Therefore, the heat needs to be dissipated for the heat emitting component to ensure normal operating. Specifically, the heat dissipation apparatus may be disposed on a heat dissipation channel between the circuit board and the housing. The heat dissipation apparatus accelerates air flow on the heat dissipation channel, so as to dissipate heat for the circuit board in the communications device. A specific structure and a beneficial effect of the heat dissipation apparatus are the same as those of the heat dissipation apparatus in the first aspect, and details are not described herein again.

BRIEF DESCRIPTION OF DRAWINGS

To describe the technical solutions in the embodiments of the present invention more clearly, the following briefly describes the accompanying drawings required for describing the embodiments or the prior art. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely some but not all of the embodiments of the present invention. All other embodiments obtained by persons of ordinary skill in the art based on the embodiments of the present invention without creative efforts shall fall within the protection scope of the present invention.

In descriptions of embodiments of the present invention, it should be understood that, directions or positional relationships indicated by terms "center", "up", "down", "front", "back", "left", "right", "vertical", "horizontal", "top", "bottom", "inside", "outside", and the like are based on directions or positional relationships shown by the accompanying drawings, which are used only for describing embodiments of the present invention and for description simplicity, but do not indicate or imply that an indicated apparatus or element must have a specific orientation or must be constructed and operated in a specific orientation.

In the descriptions of embodiments of the present invention, it should be noted that, terms "mounting", "joint", and "connection" should be understood in a broad sense. For example, "connection" may be a fixed connection, a dismountable connection, an integrated connection or any other type of connection. For persons of ordinary skill in the art, a specific meaning of the foregoing terms in the present invention may be understood according to a specific situation or a broad situation.

Figure 1:
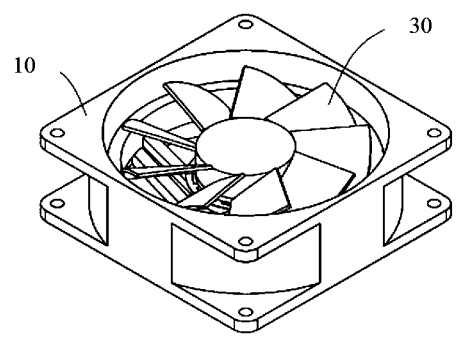
FIG. 1 is a schematic structural diagram of a heat dissipation apparatus in the prior art.
Figure 2:
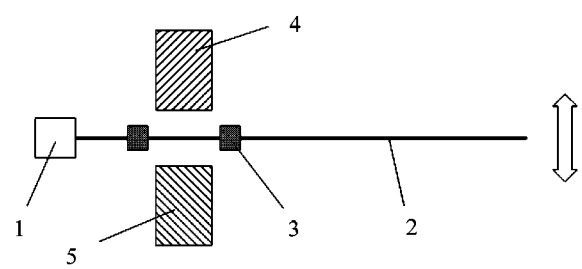
FIG. 2 is a schematic structural diagram of a heat dissipation apparatus according to an embodiment of the present invention.

As shown in FIG. 2, an embodiment of the present invention provides a heat dissipation apparatus, including: a base 1; a swing plate 2, where the swing plate 2 includes a fastening end and a free end, the fastening end is fastened to the base 1, the free end may swing relative to the fastening end, and a loop coil 3 is disposed on the swing plate 2; and a magnet assembly, where the magnet assembly includes a first magnet 4 and a second magnet 5 that are fastened relative to the base 1, same magnetic poles of the first magnet 4 and the second magnet 5 are opposite to each other, the first magnet 4 and the second magnet 5 are located on two sides of the loop coil 3, and when a current whose direction periodically varies flows through the loop coil 3, an Ampere force whose direction periodically varies is applied to the loop coil 3 under an action of a magnetic field formed by the magnet assembly, so that the loop coil 3 drives the swing plate 2 to swing back and forth.

The heat dissipation apparatus provided in this embodiment of the present invention includes the base 1, the swing plate 2, and the magnet assembly. The fastening end of the swing plate 2 is fastened to the base 1, and the other end serving as the free end may swing relative to the fastening end. The loop coil 3 is further disposed on the swing plate 2, and the first magnet 4 and the second magnet 5 whose same poles are opposite to each other are connected to the base 1 in a fastening manner and are located on the two sides of the loop coil 3. Because the same poles of the first magnet 4 and the second magnet 5 are opposite to each other, a direction of a magnetic field between the first magnet 4 and the second magnet 5 is basically parallel to the loop coil 3. When a periodic-varying current flows through the loop coil 3, according to a magnetic field force principle of an electrified conductor, a downward or upward Ampere force perpendicular to the loop coil 3 may be applied to the loop coil 3, so that the loop coil 3 drives the swing plate 2 to swing back and forth, and air flows to dissipate heat for a to-be-cooled object. Only the swing plate 2 with the fastening end needs to be disposed in a structure of the heat dissipation apparatus, and Ampere forces from the first magnet 4 and the second magnet 5 to an electrified coil are utilized to drive the swing plate 2 to swing. Therefore, in comparison with the prior art, if a size of a rotary cooling fan is close to a size of the swing plate 2 in this embodiment of the present invention, an air vibration range is smaller when swing is compared with rotation, and a bearing-free solution is used, so that generated noise is lower.

It should be noted that, feature sizes of some micro electronic components such as a mobile phone and other mobile terminals are generally very small. When heat needs to be dissipated for such a micro electronic component, if a blade size of a rotary cooling fan is close to the size of the swing plate 2 in this embodiment of the present invention, swing occupies smaller space compared with rotation. Therefore, compared with an electromagnetic rotary fan in the prior art, the heat dissipation apparatus in this embodiment of the present invention is better suited to heat dissipation of such a micro electronic component with a relatively small feature size.

It should be noted that, in some scenarios, for example, in heat dissipation of a micro electronic component, the heat dissipation apparatus in this embodiment of the present invention may be used together with another heat dissipation apparatus such as liquid cooling, to obtain a better heat dissipation effect.

Figure 3:
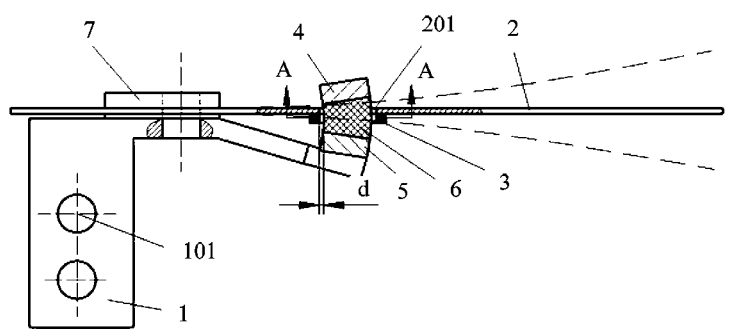
FIG. 3 is a schematic structural diagram in which a magnetic conductive part is disposed on a heat dissipation apparatus according to an embodiment of the present invention.
Figure 4:
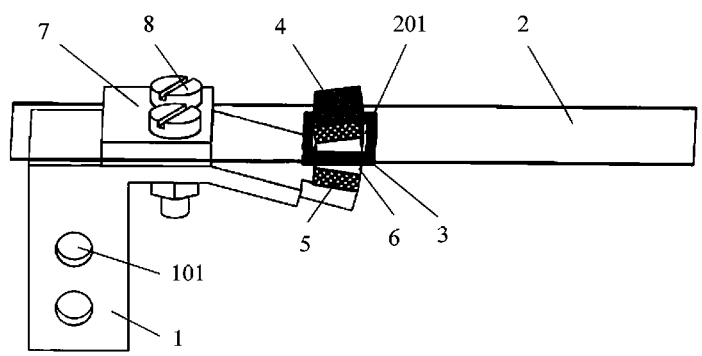
FIG. 4 is a schematic diagram of a three-dimensional structure in which a magnetic conductive part is disposed on a heat dissipation apparatus according to an embodiment of the present invention.

As shown in FIG. 3 and FIG. 4, to more efficiently convert a magnetic field into mechanical motion, a through hole 201 is disposed on the swing plate 2, the loop coil 3 is disposed around the through hole 201, the magnet assembly includes a magnetic conductive part 6, the magnetic conductive part 6 penetrates through the through hole 201, and two ends of the magnetic conductive part 6 are respectively connected to the same magnetic poles of the first magnet 4 and the second magnet 5.

Figure 5:
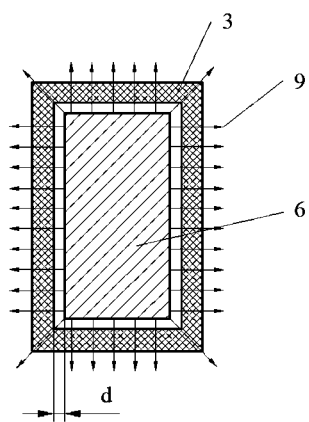
FIG. 5 is a schematic structural diagram of cross sections of a magnetic conductive part and a loop coil in a heat dissipation apparatus according to an embodiment of the present invention.

The magnetic conductive part 6 is disposed between the first magnet 4 and the second magnet 5, and the two ends of the magnetic conductive part 6 are respectively connected to the same magnetic poles of the first magnet 4 and the second magnet 5. Therefore, the magnetic conductive part 6 can adjust magnetic field distribution of the first magnet 4 and the second magnet 5, so that the magnetic field between the first magnet 4 and the second magnet 5 is not weakened by repulsion of the same magnetic poles. In addition, on an outer surface of the magnetic conductive part 6, a magnetic direction is a direction approximately perpendicular to the outer surface of the magnetic conductive part 6, that is, a direction parallel to the loop coil 3, as shown in FIG. 5. When a current flows through the loop coil 3, according to the magnetic field force principle of the electrified conductor, a downward or upward vertical force is applied to the loop coil 3. Further, as a direction of the current that flows through the loop coil 3 periodically varies, the loop coil 3 may drive the swing plate 2 to swing back and forth. In comparison with a solution in which the magnetic conductive part 6 is not disposed, a magnetic force between the first magnet 4 and the second magnet 5 is strengthened because of the magnetic conductive part 6, the Ampere force applied to the loop coil 3 is relatively large, directions are basically consistent, and a magnetic field is efficiently converted into mechanical motion.

Figure 6:
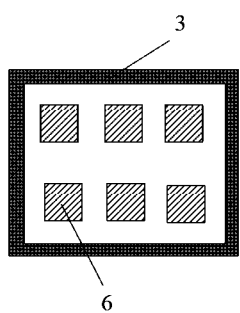
FIG. 6 is a schematic cross-section diagram in which multiple magnet assemblies are disposed in a through hole in a heat dissipation apparatus according to an embodiment of the present invention.

It should be noted that, a periodic current that flows through the loop coil 3 may be a sinewave alternating current. When an excitation frequency of the loop coil 3 is consistent with a natural swing frequency of the swing plate 2, the swing plate 2 generates a resonance, and output amplitude at an end part is maximum. In the heat dissipation apparatus in this embodiment of the present invention, the through hole 201 is disposed to enable the magnetic conductive part 6 to penetrate through the through hole 201. Certainly, the through hole may be disposed when the magnetic conductive part is not disposed. Specifically, referring to FIG. 2, when the loop coil 3 is not electrified, the loop coil 3 is located between the first magnet 4 and the second magnet 5. When a periodic-varying current flows through the loop coil 3, the swing plate 2 is driven to swing. In a swing process, the loop coil 3 may be out of a range between the first magnet 4 and the second magnet 5 due to inertance or the like. Therefore, the through hole 201 may be disposed, so that when the loop coil 3 is out of the range between the first magnet 4 and the second magnet 5, the first magnet 4 or the second magnet 5 may penetrate through the through hole 201. In this way, unnecessary collision between the swing plate 2 and a magnet can be avoided. In addition, as shown in FIG. 6, multiple magnet assemblies including the first magnet 4, the second magnet 5, and the magnetic conductive part 6 may be disposed in the through hole 201, and the loop coil may drive the swing plate to swing.

Referring to FIG. 3 and FIG. 4, sections that are of the magnetic conductive part 6 and that are on the two sides of the loop coil are symmetrically distributed relative to the loop coil 3. The loop coil 3 drives the swing plate to swing back and forth, and the sections that are of the magnetic conductive part 6 and that are on the two sides of the loop coil are symmetrically distributed relative to the loop coil 3, so that distances from the two sides of the loop coil 3 to the first magnet 4 and the second magnet 5 are equal. Correspondingly, the swing plate can swing by making the most of this part of space in a swing process.

Referring to FIG. 3, FIG. 4, and FIG. 5, to enable the swing plate to swing more regularly, the magnetic conductive part 6 is an arc-shaped magnetic conductive block, and when the swing plate 2 swings, there is a constant gap between an inner wall of the loop coil 3 and an outer wall of the arc-shaped magnetic conductive block. As shown in FIG. 5, when the heat dissipation apparatus operates, the loop coil 3 drives the swing plate 2 to swing. In this case, if a gap distance d between an inner circle of the loop coil 3 and the magnetic conductive part 6 is shorter, density of a corresponding magnetic induction line is larger, and more energy is obtained. The magnetic conductive part 6 is made in an arc shape, so that the distance between the outer wall of the magnetic conductive part 6 and the inner wall of the loop coil 3 can be as short as possible in a motion process. In an operating process of the heat dissipation apparatus, the distance d between the inner wall of the loop coil 3 and the outer wall of the arc-shaped magnetic conductive part 6 is constant, so that the loop coil 3 obtains a relatively steady Ampere force in a motion process, and further, the loop coil 3 drives the swing plate 2 to swing more regularly.

It should be noted that, if the inner wall of the loop coil 3 is closer to the outer wall of the arc-shaped magnetic conductive part 6, more energy is obtained, and relatively high energy transmission efficiency is further implemented. The distance d between the inner wall of the loop coil 3 and the outer wall of the arc-shaped magnetic conductive part 6 is constant. By means of experiment, the distance d between the loop coil 3 and the magnetic conductive part 6 needs to keep at a range from 0.02 millimeter to 2 millimeters. Optionally, it is ensured that the distance is at a range from 0.1 millimeter to 1 millimeter. Certainly, in actual processing, due to a processing error and the like, there may be a small error of the distance between the magnetic conductive part 6 and the loop coil 3, and a constant gap cannot be ensured. Based on such a reason, the distance between the magnetic conductive part 6 and the loop coil 3 may be at a reasonable tolerance range and be unequal, which belongs to the protection scope of the present invention.

A shape of the through hole 201 may be flexibly set, for example, a circle or a rectangle, a cross-section shape of the magnetic conductive part 6 matches the shape of the through hole 201, and a shape of the coil 3 matches the shape of the through hole.

The loop coil 3 is disposed on the swing plate 2 and is located between the first magnet 4 and the second magnet 5. Specifically, the loop coil 3 may be embedded in the through hole 201, or may be located on a surface of one side of the swing plate 2, as shown in FIG. 3. The loop coil 3 needs to be fastened to the swing plate. For example, when the loop coil 3 is embedded in the through hole 201, the loop coil 3 is stuck to the swing plate. Because a sticking area is relatively small, connection is not sturdy. However, if the loop coil 3 is located on a surface of one side of the swing plate 2, connection by means of sticking is sturdier.

Referring to FIG. 3, to enlarge swing amplitude of the free end of the swing plate 2 and improve a heat dissipation effect, the loop coil 3 is disposed close to the fastening end of the swing plate 2. Under an action of an Ampere force, the loop coil 3 drives the free end of the swing plate 2 to swing relative to the fastening end of the swing plate 2. If a distance of motion of the swing plate 2 driven by the loop coil 3 does not change and a length of the swing plate 2 is constant, when the loop coil 3 is closer to the fastening end of the swing plate 2, swing amplitude of the free end of the swing plate 2 is larger. Enlargement of the swing amplitude may accelerate air exchange, and further, a heat dissipation effect of the heat dissipation apparatus is improved.

Figure 7:
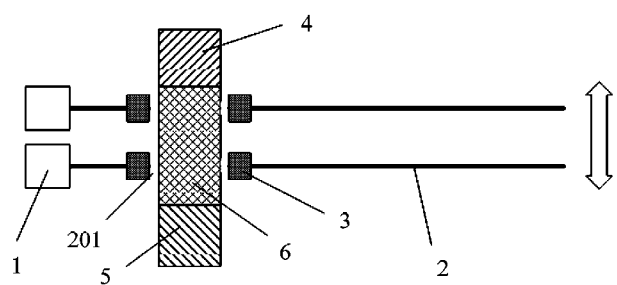
FIG. 7 is a schematic structural diagram in which multiple swing plates are disposed on a heat dissipation apparatus according to an embodiment of the present invention.

As shown in FIG. 7, according to different structure requirements, there are multiple swing plates 2, the multiple swing plates 2 are stacked at intervals, all the multiple swing plates are located between the first magnet 4 and the second magnet 6 and are provided with through holes 201, and the magnetic conductive part 6 successively penetrates through the through holes 201 on the multiple swing plates 2. In this way, when periodic-varying currents flow through multiple loop coils 3, under an action of the magnetic conductive assembly, the multiple swing plates 2 may be driven to swing. Disposing of the multiple swing plates 2 improves a heat dissipation effect.

The fastening end of the swing plate 2 is fastened to the base, and the fastening end may be fastened in multiple fastening manners. For example, the fastening end is connected to the base by using a bolt, a pin, or a rivet, or by means of bonding. As shown in FIG. 4, the heat dissipation apparatus further includes a clamp 7, the fastening end of the swing plate 2 is nipped in a fastening manner between the clamp 7 and the base 1, and the clamp 7 is connected to the base 1 by using a bolt 8. The swing plate 2 is fastened by using the bolt, and mounting and detachment of the swing plate 2 are convenient.

The swing plate 2 swings back and forth when the heat dissipation apparatus operates, and therefore, materials with better fatigue resistance need to be used. For example, the swing plate 2 is made of carbon fiber or stainless steel. A carbon fiber material is light, has a high modulus, and is fatigue-resistant; and a stainless steel material is corrosion-resistant and fatigue-resistant.

As shown in FIG. 3 and FIG. 4, in the heat dissipation apparatus in this embodiment of the present invention, a mounting hole 101 is further disposed on the base 1, and the mounting hole 101 helps fasten the heat dissipation apparatus in different heat dissipation occasions. A specific structure and a connection method of the mounting hole 101 may flexibly vary according to a mounting occasion.

Another aspect of the present invention further provides a communications device, including a housing, a circuit board, and the heat dissipation apparatus described above. The circuit board is mounted in the housing, a heat emitting component is disposed on the circuit board, and the heat dissipation apparatus is configured to dissipate heat for the heat emitting component.

In the communications device provided in this embodiment of the present invention, when the circuit board is electrified and enters into an operating mode, the heat emitting component on the circuit board generates heat. Therefore, it is required to dissipate the heat for the heat emitting component to ensure normal operating. Specifically, the heat dissipation apparatus may be disposed on a heat dissipation channel between the circuit board and the housing. The heat dissipation apparatus accelerates air flow on the heat dissipation channel, so as to dissipate heat for the circuit board in the communications device. A specific structure and a beneficial effect of the heat dissipation apparatus are the same as those of the heat dissipation apparatus described above, and details are not described herein again.

It should be noted that, the heat dissipation apparatus is disposed on the heat dissipation channel, an air exhaust direction of the swing plate 2 may be consistent with a direction set for an air duct, or may be directly a direction towards the circuit board. Generally, in the communications device, in addition to internal resistance of the circuit board, heat emitting of the circuit board is related to an electronic component disposed on the circuit board. Therefore, to ensure normal operating of the circuit board and the electronic component, these heating electronic components are disposed on the edge of the circuit board or at a position close to the heat dissipation channel. In addition, an air exhaust vent of the heat dissipation apparatus may be disposed towards these heating electronic components.

To improve a heat dissipation effect, in addition to the heat dissipation apparatus in the first aspect, a liquid cooling heat dissipation system that is used together with the heat dissipation apparatus is set in the communications device provided in this embodiment of the present invention. For example, a common liquid cooling heat dissipation system mainly includes a circulating pipeline made of heat conducting materials and a heat dissipation plate connected to the pipeline. A coolant is placed in the pipeline, and the pipeline is in contact with a to-be-cooled electronic component, so that the coolant absorbs heat of the to-be-cooled electronic component. The coolant flows through the circulating pipeline, and transfers heat to the heat dissipation plate, and then the heat dissipation plate dissipates the heat to ambient air. The heat dissipation apparatus in the foregoing embodiment of the present invention is disposed around the heat dissipation plate to dissipate heat for the heat dissipation plate. Specifically, a free end of a swing plate is disposed towards the heat dissipation plate, and when a periodic-varying current flows through the heat dissipation apparatus, the free end of the swing plate swings relative to a fastening end, and the air exhaust direction faces the heat dissipation plate. In this way, exchange between heat on the heat dissipation plate and ambient air can be accelerated. The liquid cooling heat dissipation system is used together with the heat dissipation apparatus in the foregoing embodiment, thereby producing a better heat dissipation effect.

Finally, it should be noted that, the foregoing embodiments are merely intended for describing the technical solutions of the present invention but not for limiting the present invention. Although embodiments of the present invention are described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. A heat dissipation apparatus, comprising:
a base;
a swing plate, wherein the swing plate comprises a fastening end and a free end, the fastening end is fastened to the base, the free end may swing relative to the fastening end, and a loop coil is disposed on the swing plate; and
a magnet assembly, wherein the magnet assembly comprises a first magnet and a second magnet that are fastened relative to the base, same magnetic poles of the first magnet and the second magnet are opposite to each other, the first magnet and the second magnet are located on two sides of the loop coil, and when a current whose direction periodically varies flows through the loop coil, an Ampere force whose direction periodically varies is applied to the loop coil under an action of a magnetic field formed by the magnet assembly, so that the loop coil drives the swing plate to swing back and forth;
wherein a through hole is disposed on the swing plate, the loop coil is disposed around the through hole, the magnet assembly comprises a magnetic conductive part, the magnetic conductive part penetrates through the through hole, and two ends of the magnetic conductive part are respectively connected to the same magnetic poles of the first magnet and the second magnet; and
wherein the magnetic conductive part is an arc-shaped magnetic conductive block, and when the swing plate swings, there is a constant gap between an inner wall of the loop coil and an outer wall of the arc-shaped magnetic conductive block.

2. The heat dissipation apparatus according to claim 1, wherein sections that are of the magnetic conductive part and that are on the two sides of the loop coil are symmetrically distributed relative to the loop coil.

3. The heat dissipation apparatus according to claim 1, wherein a shape of the through hole is a circle or a rectangle, a cross-section shape of the magnetic conductive part matches the shape of the through hole, and a shape of the coil matches the shape of the through hole.

4. The heat dissipation apparatus according to claim 1, wherein the loop coil is embedded in the through hole.

5. The heat dissipation apparatus according to claim 1, wherein the loop coil is located on a surface of one side of the swing plate.

6. The heat dissipation apparatus according to claim 1, wherein the loop coil is disposed close to the fastening end of the swing plate.

7. The heat dissipation apparatus according to claim 1, wherein there are multiple swing plates, the multiple swing plates are stacked at intervals, all the multiple swing plates are located between the first magnet and the second magnet and are provided with through holes, and the magnetic conductive part successively penetrates through the through holes on the multiple swing plates.

8. A communications device, comprising a housing, a circuit card, and a heat dissipation apparatus, wherein the circuit card is mounted in the housing, a heat emitting component is disposed on the circuit card, and the heat dissipation apparatus is configured to dissipate heat for the heat emitting component;

wherein the heat dissipation apparatus comprises:

a base;

a swing plate, wherein the swing plate comprises a fastening end and a free end, the fastening end is fastened to the base, the free end may swing relative to the fastening end, and a loop coil is disposed on the swing plate; and a magnet assembly, wherein the magnet assembly comprises a first magnet and a second magnet that are fastened relative to the base, same magnetic poles of the first magnet and the second magnet are opposite to each other, the first magnet and the second magnet are located on two sides of the loop coil, and when a current whose direction periodically varies flows through the loop coil, an Ampere force whose direction periodically varies is applied to the loop coil under an action of a magnetic field formed by the magnet assembly, so that the loop coil drives the swing plate to swing back and forth;

wherein a through hole is disposed on the swing plate, the loop coil is disposed around the through hole, the magnet assembly comprises a magnetic conductive part, the magnetic conductive part penetrates through the through hole, and two ends of the magnetic conductive part are respectively connected to the same magnetic poles of the first magnet and the second magnet; and wherein the magnetic conductive part is an arc-shaped magnetic conductive block, and when the swing plate swings, there is a constant gap between an inner wall of the loop coil and an outer wall of the arc-shaped magnetic conductive block.

9. The communications device according to claim 8, wherein sections that are of the magnetic conductive part and that are on the two sides of the loop coil are symmetrically distributed relative to the loop coil.

10. The communications device according to claim 8, wherein a shape of the through hole is a circle or a rectangle, a cross-section shape of the magnetic conductive part matches the shape of the through hole, and a shape of the coil matches the shape of the through hole.

11. The communications device according to claim 8, wherein the loop coil is embedded in the through hole.

12. The communications device according to claim 8, wherein the loop coil is located on a surface of one side of the swing plate.

13. The communications device according to claim 8, wherein the loop coil is disposed close to the fastening end of the swing plate.

14. The communications device according to claim 8, wherein there are multiple swing plates, the multiple swing plates are stacked at intervals, all the multiple swing plates are located between the first magnet and the second magnet and are provided with through holes, and the magnetic conductive part successively penetrates through the through holes on the multiple swing plates.

* * * * *